United States Patent
Compton et al.

(10) Patent No.: US 8,174,601 B2
(45) Date of Patent: May 8, 2012

(54) IMAGE SENSOR WITH CONTROLLABLE TRANSFER GATE OFF STATE VOLTAGE LEVELS

(75) Inventors: John T. Compton, LeRoy, NY (US); Hirofumi Komori, Kanagawa (JP)

(73) Assignee: OmniVision Technologies, Inc., Santa Clara, CA (US)

( * ) Notice: Subject to any disclaimer, the term of this patent is extended or adjusted under 35 U.S.C. 154(b) by 672 days.

(21) Appl. No.: 12/339,131

(22) Filed: Dec. 19, 2008

(65) Prior Publication Data

US 2010/0157120 A1    Jun. 24, 2010

(51) Int. Cl.
H04N 3/14     (2006.01)
H04N 5/335    (2006.01)
(52) U.S. Cl. .................... 348/308; 348/294; 348/302
(58) Field of Classification Search .......... 348/294, 348/308, 394
See application file for complete search history.

(56) References Cited

U.S. PATENT DOCUMENTS

| | | |
|---|---|---|
| 3,971,065 A | 7/1976 | Bayer |
| 2006/0146157 A1 | 7/2006 | Toros et al. |
| 2006/0146158 A1 * | 7/2006 | Toros et al. ............... 348/308 |
| 2007/0024931 A1 | 2/2007 | Compton et al. |
| 2007/0040922 A1 * | 2/2007 | McKee et al. ............. 348/308 |
| 2007/0146522 A1 * | 6/2007 | Okada et al. .............. 348/311 |
| 2008/0258045 A1 * | 10/2008 | Oike et al. ............... 250/208.1 |
| 2009/0101796 A1 * | 4/2009 | Ladd et al. ............... 250/206 |
| 2009/0160993 A1 * | 6/2009 | Kato et al. ............... 348/312 |

FOREIGN PATENT DOCUMENTS

EP     1 648 160 A1    4/2006

* cited by examiner

*Primary Examiner* — Sinh Tran
*Assistant Examiner* — Shahbaz Nazrul
(74) *Attorney, Agent, or Firm* — Blakely Sokoloff Taylor & Zafman LLP

(57) ABSTRACT

A CMOS image sensor or other type of image sensor comprises a pixel array and a signal generator coupled to the pixel array. The pixel array comprises a plurality of pixels each having a photosensitive element coupled to a transfer gate. The signal generator is configured to generate a transfer gate signal for application to at least one of the transfer gates. The transfer gate signal has at least an on state voltage level and first and second off state voltage levels, with the first off state voltage level typically having a higher magnitude than that of the second off state voltage level. In an illustrative embodiment, the second off state voltage level is utilized during a readout operation in order to reduce dark current in floating diffusion regions of the pixel array.

19 Claims, 6 Drawing Sheets

… (1)

IMAGE SENSOR WITH CONTROLLABLE TRANSFER GATE OFF STATE VOLTAGE LEVELS

FIELD OF THE INVENTION

The present invention relates generally to electronic image sensors for use in digital cameras and other types of imaging devices, and more particularly to image readout in an electronic image sensor.

BACKGROUND OF THE INVENTION

A typical electronic image sensor comprises a number of photodiodes or other photosensitive elements arranged in a two-dimensional array. These elements are also commonly referred to as picture elements or "pixels" and the corresponding array is referred to as a pixel array. Light incident on the pixel array is converted to electrical charge by the photosensitive elements. Collected electrical charge for a given image capture period is read from the photosensitive elements of the pixel array using an active pixel sensor (APS) or charge-coupled device (CCD) arrangement.

As is well known, an image sensor may be implemented using complementary metal-oxide-semiconductor (CMOS) circuitry. An image sensor of this type is commonly referred to as a CMOS image sensor. In such an arrangement, each pixel comprises at least a photodiode and a transfer gate. The transfer gate is utilized to control the transfer of collected electrical charge from the photodiode to a sensing node in conjunction with an image readout process. The sensing node usually comprises a floating diffusion. Each pixel may include its own floating diffusion, or a single floating diffusion may be shared by a small group of pixels. As examples of the latter arrangement, groups of two, three or four pixels may each share a single floating diffusion. Each of the pixels of a given such group includes a transfer gate for controllably connecting the corresponding photodiode to the floating diffusion during image readout. Other readout circuitry may be shared between multiple pixels, such as a reset gate, an output transistor and a row select transistor.

A given transfer gate may be generally viewed as having two states of operation, namely, an on state, in which the transfer gate is conducting and transfers collected charge from the photodiode to the floating diffusion, and an off state, in which the transfer gate is non-conducting and effectively disconnects the photodiode from the floating diffusion. The transfer gate is placed in the on state or the off state by applying respective on state or off state voltage levels to the transfer gate. The transfer gate is usually placed in its on state for only brief periods of time sufficient to transfer collected charge from the photodiode and is otherwise kept in its off state. In accordance with conventional practice, the off state voltage level is usually set to a level that is sufficiently large to avoid leakage from the floating diffusion into the photodiode. This leakage is considered a form of photodiode dark current.

Another type of leakage can arise when using the above-described transfer gate. This leakage is referred to herein as gate-induced drain leakage (GIDL), and can cause an undesirable change in the floating diffusion potential between reset sampling of the floating diffusion prior to transfer of the collected charge from the photodiode and signal sampling of the floating diffusion subsequent to transfer of the collected charge from the photodiode. GIDL may be viewed as a form of floating diffusion dark current.

Conventional image readout techniques have not adequately addressed the relationship between photodiode dark current and floating diffusion dark current attributable to GIDL. Accordingly, a need exists for improved image readout techniques that provide an appropriate mechanism for reducing the negative impacts of both of these types of dark current on image sensor performance.

SUMMARY OF THE INVENTION

Illustrative embodiments of the invention provide an image sensor in which transfer gates of a pixel array are driven by a transfer gate signal having multiple off state voltage levels.

In accordance with one aspect of the invention, an image sensor comprises a pixel array and a signal generator coupled to the pixel array. The pixel array comprises a plurality of pixels each having a photosensitive element coupled to a transfer gate. The signal generator is configured to generate a transfer gate signal for application to at least one of the transfer gates. The transfer gate signal has at least an on state voltage level and first and second off state voltage levels. The first off state voltage level typically has a higher magnitude than that of the second off state voltage level. The second off state voltage level may be utilized during a readout operation in order to reduce dark current in floating diffusion regions of the pixel array.

In a first illustrative embodiment, the multiple off state voltage levels of the transfer gate signal are generated by switching a corresponding transfer gate signal line between the first and second off state voltage levels responsive to an off state voltage level control signal.

In a second illustrative embodiment, the multiple off state voltage levels of the transfer gate signal are generated by altering a voltage level applied to a well in which the pixels are formed. The applied voltage level is altered responsive to a well voltage level control signal.

An image sensor in accordance with the invention may be implemented in a digital camera or other type of imaging device. The illustrative embodiments advantageously reduce the negative impacts of both photodiode dark current and GIDL-based floating diffusion dark current, thereby improving image sensor readout performance.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

The present invention will be illustrated herein in conjunction with particular embodiments of digital cameras, image sensors, image sensor circuitry and associated image readout techniques. It should be understood, however, that these illustrative arrangements are presented by way of example only, and should not be viewed as limiting the scope of the invention in any way. Those skilled in the art will recognize that the disclosed arrangements can be adapted in a straightforward manner for use with a wide variety of other types of imaging devices, image sensors, image sensor circuitry and associated image readout techniques.

Figure 1:
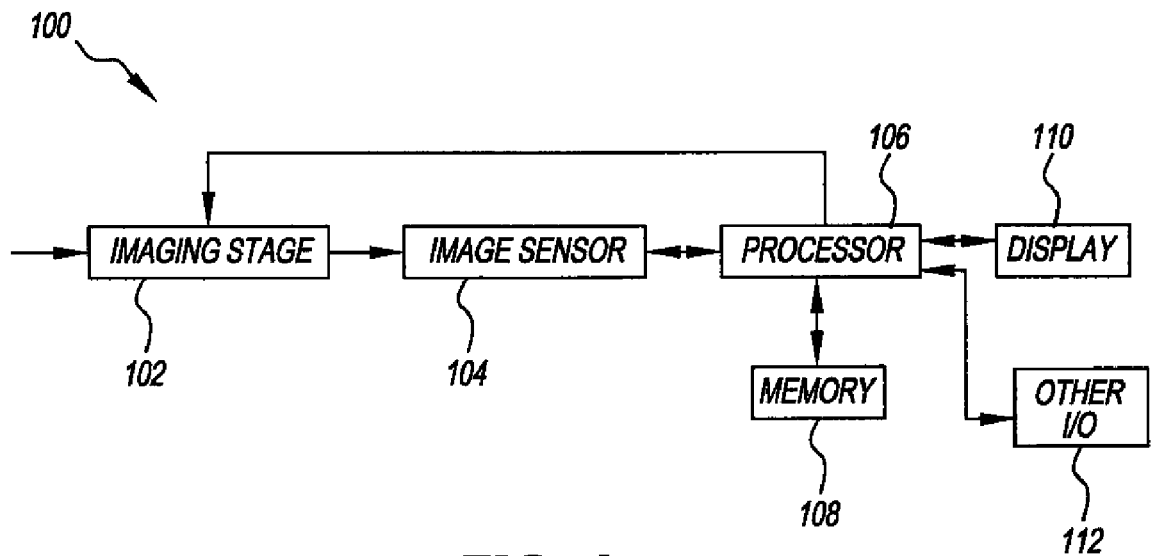
FIG. 1 is a block diagram of a digital camera having an image sensor configured in accordance with an embodiment of the invention.

FIG. 1 shows a digital camera 100 in an illustrative embodiment of the invention. In the digital camera, light from a subject scene is input to an imaging stage 102. The imaging stage may comprise conventional elements such as a lens, a neutral density filter, an iris and a shutter. The light is focused by the imaging stage 102 to form an image on an image sensor 104, which converts the incident light to electrical signals. The digital camera 100 further includes a processor 106, a memory 108, a display 110, and one or more additional input/output (I/O) elements 112.

Although shown as separate elements in the embodiment of FIG. 1, the imaging stage 102 may be integrated with the image sensor 104, and possibly one or more additional elements of the digital camera 100, to form a compact camera module.

The image sensor 104 will typically be implemented as a color image sensor having an associated color filter array (CFA) pattern. One type of CFA pattern that may be used in the image sensor 104 is the well-known Bayer pattern, disclosed in U.S. Pat. No. 3,971,065, entitled "Color Imaging Array," which is incorporated by reference herein. Other examples of CFA patterns that may be used in image sensor 104 include those disclosed in U.S. Patent Application Publication No. 2007/0024931, entitled "Image Sensor with Improved Light Sensitivity," which is incorporated by reference herein. These include patterns which provide certain of the pixels with a panchromatic photoresponse. Such patterns are also generally referred to herein as "sparse" CFA patterns. Image sensors configured with sparse CFA patterns exhibit greater light sensitivity and are thus well-suited for use in applications involving low scene lighting, short exposure time, small aperture, or other restrictions on the amount of light reaching the image sensor.

The processor 106 may comprise, for example, a microprocessor, a central processing unit (CPU), an application-specific integrated circuit (ASIC), a digital signal processor (DSP), or other processing device, or combinations of multiple such devices. Various elements of the imaging stage 102 and the image sensor 104 may be controlled by timing signals or other signals supplied from the processor 106.

The memory 108 may comprise any type of memory, such as, for example, random access memory (RAM), read-only memory (ROM), Flash memory, disk-based memory, removable memory, or other types of storage elements, in any combination.

A given image captured by the image sensor 104 may be stored by the processor 106 in memory 108 and presented on display 110. The display 110 is typically an active matrix color liquid crystal display (LCD), although other types of displays may be used. The additional I/O elements 112 may comprise, for example, various on-screen controls, buttons or other user interfaces, network interfaces, memory card interfaces, etc.

Additional details regarding the operation of a digital camera of the type shown in FIG. 1 can be found, for example, in the above-cited U.S. Patent Application Publication No. 2007/0024931.

The image sensor 104 is assumed in the present embodiment to be a CMOS image sensor, although other types of image sensors may be used in implementing the invention.

Figure 2:
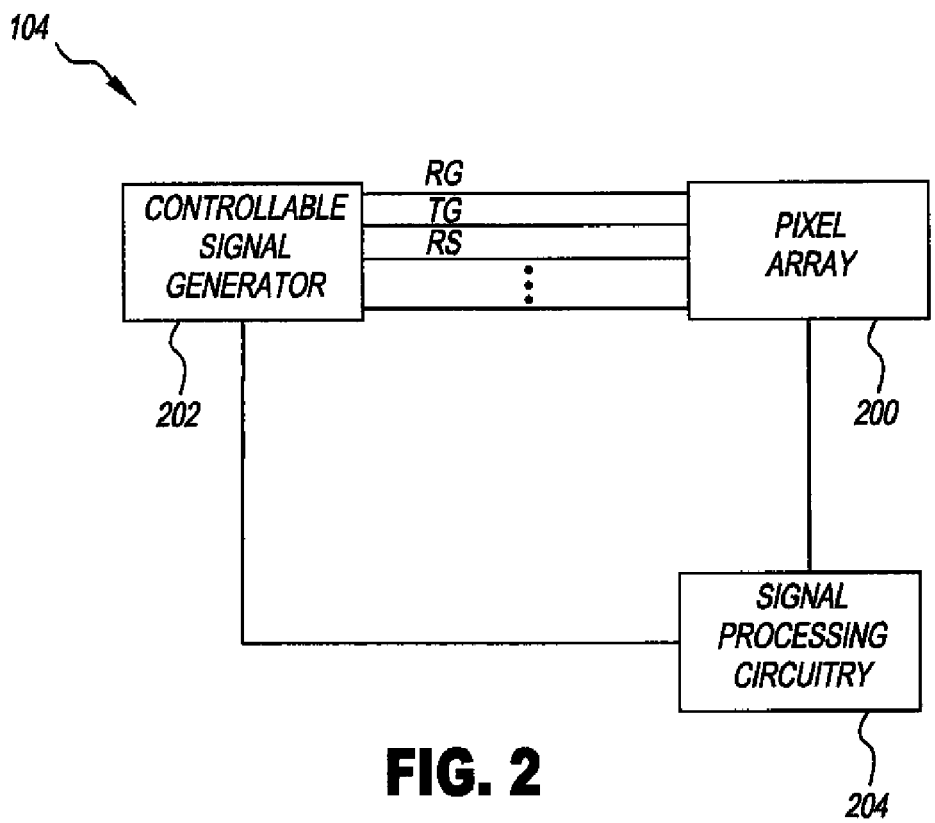
FIG. 2 is a block diagram showing a more detailed view of a portion of the image sensor of the digital camera of FIG. 1.

As shown in FIG. 2, image sensor 104 more particularly comprises a pixel array 200, a controllable signal generator 202 and signal processing circuitry 204. In other embodiments, one or both of elements 202 and 204 may be arranged at least in part external to the image sensor.

The pixel array 200 generally includes a plurality of pixels arranged in rows and columns and as well as additional circuitry associated with readout of the pixel array, examples of which will be described below in conjunction with FIGS. 3 through 9. Each pixel of the pixel array generally comprises at least a photodiode or other type of photosensitive element coupled to a transfer gate.

The controllable signal generator 202 may operate under control of the processor 106 to generate signals associated with readout of the pixel array 30, including, by way of example, reset gate (RG) signals, transfer gate (TG) signals and row select (RS) signals, as indicated in FIG. 2. Other types of signals associated with image readout, including sampling signals such as sample-and-hold reset (SHR) and sample-and-hold signal (SHS), may also be generated by the signal generator 202.

The signal processing circuitry 204 may comprise, for example, an analog signal processor (ASP) for processing analog signals read out from the pixel array 200, one or more programmable gain amplifiers (PGAs) for amplifying such signals, and an analog-to-digital converter (ADC) for converting the amplified signals to a digital form suitable for processing by processor 106. Portions of such signal processing circuitry may be arranged external to the image sensor, or formed integrally with the pixel array 200, for example, on a common integrated circuit with photosensitive elements and other readout circuitry elements of the pixel array.

Functionality associated with readout of the pixel array 200 and the processing of corresponding image data may be implemented at least in part in the form of software that is stored in memory 108 and executed by processor 106. For example, the various signals generated by the controllable signal generator 202 may be selected or otherwise configured responsive to execution of software by the processor 106. Such software can be implemented in a straightforward manner given the teachings provided herein, as will be appreciated by those skilled in the art.

It is to be appreciated that the digital camera 100 and image sensor 104 as shown in FIGS. 1 and 2 may comprise additional or alternative elements of a type known to those skilled in the art. Elements not specifically shown or described herein may be selected from those known in the art. These and other figures described herein are simplified in order to clearly illustrate various aspects of the present invention, and are not necessarily drawn to scale. A given embodiment may include a variety of other features or elements that are not explicitly illustrated but would be familiar to one skilled in the art as being commonly associated with digital cameras, image sensors or image sensor circuitry of the general type described.

As noted above, a problem with conventional image sensors is that such sensors fail to adequately control the negative performance impacts of both photodiode dark current and GIDL-based floating diffusion dark current. The image sensor 104 is configured in the illustrative embodiments to provide improved control of both of these types of leakage through the use of multiple off state voltage levels for at least a subset of the transfer gates of the pixel array.

A given transfer gate signal will more particularly have at least three different voltage levels, namely, an on state voltage level, a first off state voltage level, and a second off state voltage level. The on state voltage level places a transfer gate in its on state, such that collected charge is transferred from the associated photodiode to the floating diffusion. The first and second off state voltage levels both place the transfer gate in its off state However, the first off state voltage level has a relatively high magnitude selected to limit photodiode dark current for periods of time during which that photodiode is not subject to a readout operation, while the second off state voltage level is reduced in magnitude relative to the first to limit floating diffusion dark current attributable to GIDL during a readout operation for that photodiode. By reducing the transfer gate off state voltage level during readout operations, the floating diffusion dark current attributable to GIDL is reduced significantly. At all other times, the transfer gate off state voltage level is maintained at a relatively high level in order to minimize photodiode dark current.

Thus, an off state voltage level of a transfer gate signal applied to one or more transfer gates of the pixel array is changed from a first level to a second level in conjunction with readout of one or more of the associated pixels. This may be achieved, for example, through configuring the signal generator 202 such that the transfer gate signal is controllably switchable between at least three distinct voltage levels including the on state voltage level and the first and second off state voltage levels. Examples of an arrangement of this type will be described with reference to FIGS. 4, 5 and 6. Another technique for changing the transfer gate off state voltage levels is through altering a well voltage of an n-well or p-well in which at least a subset of the transfer gates are formed, in embodiments which utilize such wells. An example of an arrangement of this type will be described with reference to FIGS. 7 and 8.

Figure 3:
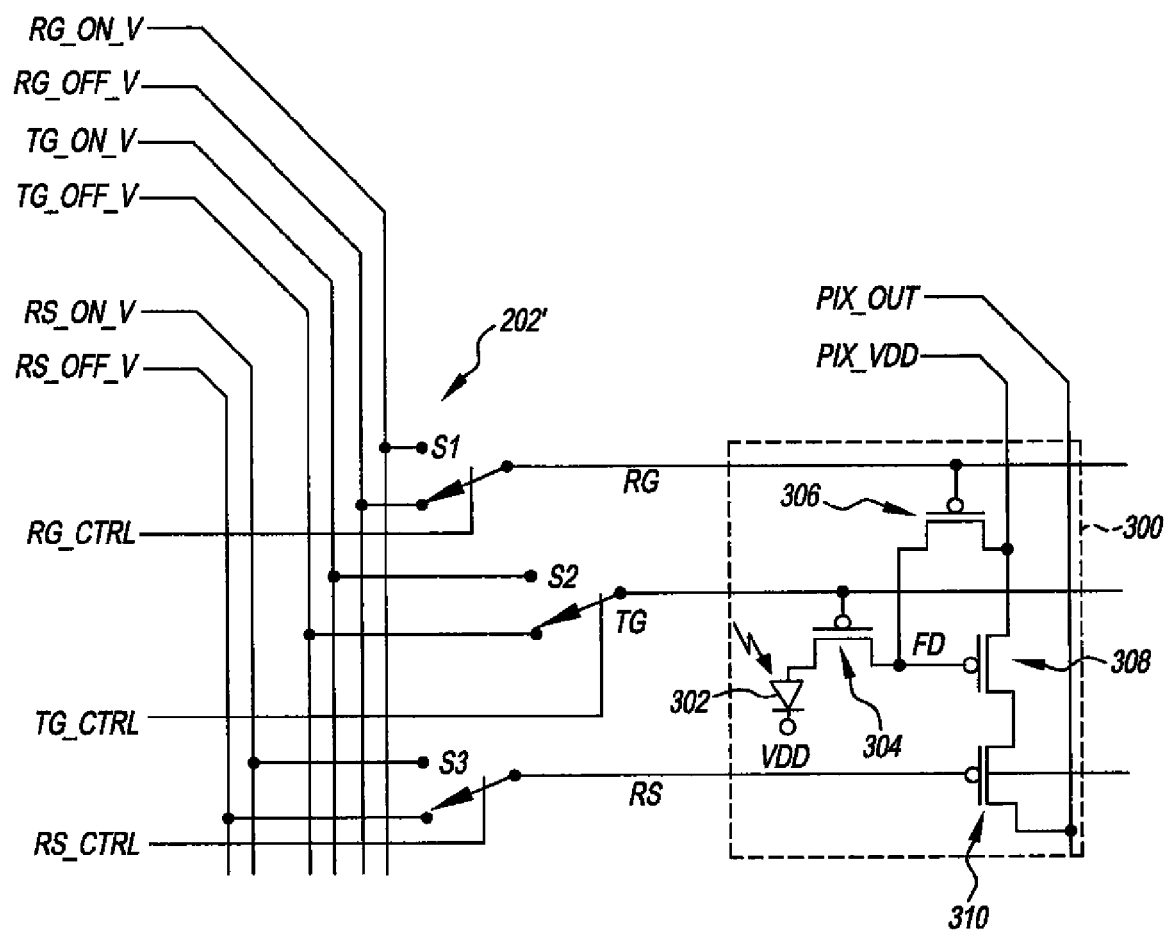
FIG. 3 shows image sensor circuitry that may be modified to incorporate controllable transfer gate off state voltage levels in the image sensor of FIG. 2.

Referring now to FIG. 3, exemplary image sensor circuitry is shown that may be modified to incorporate the above-described multiple off state voltage level feature. The image sensor circuitry comprises a pixel 300 of the pixel array 200 and a portion of a signal generator 202' which corresponds generally to signal generator 202 of FIG. 2 but without the ability to generate transfer gate signals having multiple off state voltage levels.

The pixel 300 comprises a photodiode 302 and four associated p-type MOS (PMOS) transistors 304, 306, 308 and 310. Typically, such transistors and the associated photodiode are formed in an n-well region on a p-type substrate. In other embodiments, the pixel transistors may be n-type MOS (NMOS) transistors, in which case the photodiode and the transistors are generally formed in a p-well region on an n-type substrate. In an alternative implementation of NMOS pixel transistors, the NMOS transistors are formed in a p-type epitaxial layer grown on a p-type substrate. The pixel 300 is an example of a so-called 4T pixel in that it includes four transistors.

The first transistor 304 is a transfer gate configured to transfer collected charge from the photodiode 302 to a floating diffusion (FD) responsive to a transfer gate (TG) signal. The second transistor 306 is a reset gate configured to reset the floating diffusion by coupling it to a pixel power supply voltage PIX_VDD responsive to a reset gate (RG) signal. The third transistor 308 is a source follower or output transistor configured to amplify the signal on the floating diffusion and to supply the amplified signal to a common output line PIX_OUT associated with a particular column of the pixel array. In this embodiment, the source follower is coupled to the common output line PIX_OUT via the fourth transistor 310, which is a row select transistor operative responsive to a row select (RS) signal as shown.

The RG, TG and RS signals are generated by signal generator 202' using switches S1, S2 and S3 which are controlled by respective control signals RG_CTRL, TG_CTRL and RS_CTRL. More specifically, each of the RG, TG and RS signals is controllable between corresponding on state and off state voltage levels (RG_ON_V and RG_OFF_V, TG_ON_V and TG_OFF_V, RS_ON_V and RS_OFF_V). These on state and off state voltage levels place the associated reset gate, transfer gate and row select transistor in their respective on and off states.

At least a portion of the image sensor circuitry of FIG. 3 may be repeated for each of the other pixels of the array 200. Pixels in the same row of the array may share a common RG signal, a common TG signal and a common RS signal, while pixels in the same column of the array share the common output line PIX_OUT. Thus, the RG, TG and RS lines extending to the right edge of FIG. 3 would typically connect to additional pixels in the same row. Furthermore, the array would include additional rows of pixels and associated switches, with the controls for each row generally being operated independently of the controls for the other rows.

It should be noted, however, that each pixel of the pixel array need not include its own reset gate, output transistor and row select transistor as in the FIG. 3 arrangement. Instead, a given reset gate 306, a given output transistor 308 and a given row select transistor 310 in image sensor circuitry of this type are often shared among multiple pixels. An example of such a sharing arrangement will be described below in conjunction with FIG. 6. Accordingly, the term "pixel" as used herein is intended to encompass, for example, a grouping of circuitry elements such as 302, 304, 306, 308 and 310, or an alternative grouping comprising just elements 302 and 304 in an embodiment where pixel 300 shares elements 306, 308 and 310 with other pixels. Numerous alternative arrangements of image sensor circuitry may be used in implementing a given embodiment of the invention. Conventional aspects of such circuitry are well understood by those skilled in the art and will therefore not be described in further detail herein.

Figure 4:
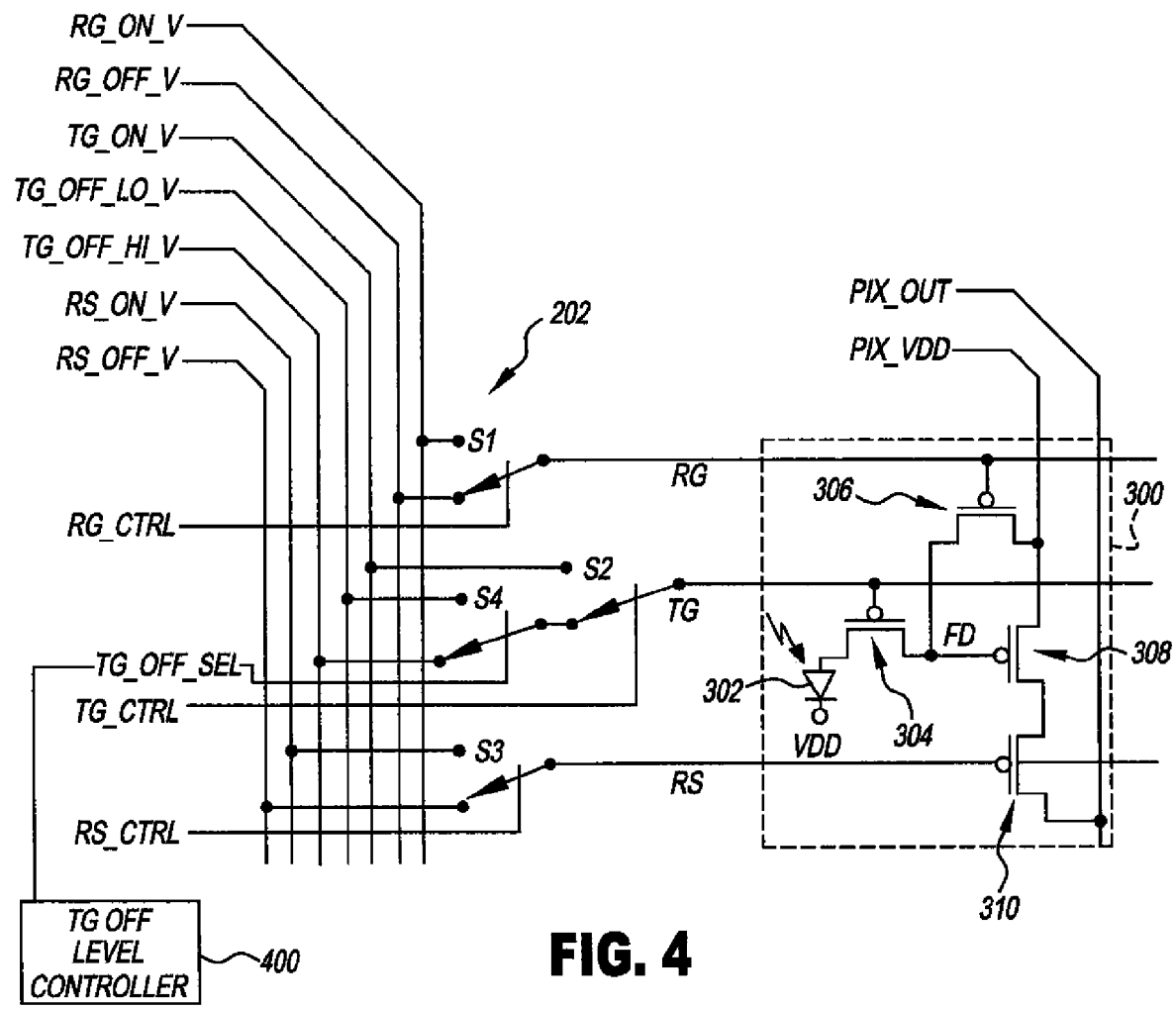
FIG. 4 illustrates the image sensor circuitry of FIG. 3 as modified to incorporate controllable transfer gate off state voltage levels.

FIG. 4 illustrates the manner in which the image sensor circuitry of FIG. 3 is modified to incorporate the above-described multiple off state voltage level feature. The image sensor circuitry as shown in FIG. 4 generally comprises pixel 300, signal generator switches S1-S3, and other elements as previously described. However, signal generator 202 in this embodiment is configured to incorporate an additional switch S4 that is operative to switch the transfer gate off state voltage level between a first off state voltage level TG_OFF_HI_V and a second off state voltage level TG_OFF_LO_V responsive to a control signal TG_OFF_SEL. The TG signal in this embodiment is therefore controllable via switches S2 and S4 between three different voltage levels, namely, the on state voltage level TG_ON_V, the first off state voltage level TG_OFF_HI_V and the second off state voltage level TG_OFF_LO_V. The TG signal is generally held at TG_OFF_HI_V at all times other than those associated with readout operations in order to reduce dark current in the photodiode 302. However, during a given readout operation of the photodiode 302, the TG signal is switched to TG_OFF_LO_V in order to reduce the floating diffusion dark current attributable to GIDL. Such GIDL-based floating diffusion dark current is only a problem during the readout operation, as this dark current adds to the signal being measured.

The TG_OFF_SEL signal in this embodiment is supplied by a TG off level controller 400. The controller 400 may be incorporated into the signal generator 202 of the image sensor 104, or alternatively may be part of the processor 106. Similar controllers may provide the control signals RG_CTRL, TG_CTRL and RS_CTRL, and may be configured using well-known circuitry arrangements. In other embodiments, a single controller may be used to provide all of the control signals for the signal generator 202, based for example on timing signals supplied from processor 106.

It should be noted that the FIG. 4 embodiment shows the additional switch S4 as part of the set of row-specific switches associated with a given row of pixels of the pixel array 200. This permits the TG off state voltage level to be changed only for the row that is being read, leaving the other rows unaffected. In an alternative embodiment, a single switch may be used to control the TG off state voltage level for all the rows, both the row being read and the rest of the rows that are not being read. Since the readout operation is of generally short duration compared to the overall row readout time, this provides the benefit of the TG_OFF_LO_V voltage during readout while leaving the TG voltage at TG_OFF_HI_V most of the time to reduce photodiode dark current. This alternative embodiment is useful in an implementation that cannot accommodate additional row-specific switches due to limited chip area or other constraints. The row-specific switches shown in FIG. 4 are preferred, however, as they provide generally lower photodiode dark current.

Figure 5:
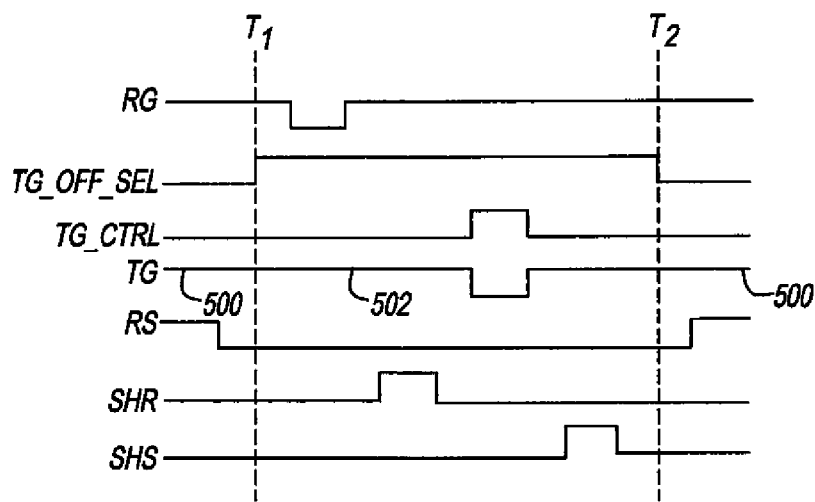
FIG. 5 is a timing diagram illustrating the operation of the image sensor circuitry of FIG. 4.

FIG. 5 is a timing diagram illustrating the operation of the image sensor circuitry of FIG. 4. The RG, TG and RS signals shown are the signals applied to the gates of the PMOS transistors 306, 304 and 310, respectively. PMOS transistors are active-low devices. Such devices are placed in their respective conducting or on states by logic low signal levels and are placed in their respective non-conducting or off states by logic high signal levels. The signaling polarity is reversed for NMOS transistors, which are active-high devices.

The timing diagram also shows the TG_CTRL signal that controls switch S2 and the TG_OFF_SEL signal that controls switch S4. A logic high signal level of the TG_CTRL signal causes the switch S2 to connect the TG signal line to the transfer gate on state voltage level TG_ON_V, while a logic low signal level of the TG_CTRL signal causes the switch S2 to connect the TG signal line to one of the two transfer gate off state voltage levels TG_OFF_HI_V or TG_OFF_LO_V depending on the state of the switch S4. More specifically, the TG signal line is connected to the first transfer gate off state voltage level TG_OFF_HI_V when TG_CTRL is at a logic low level and TG_OFF_SEL is at a logic low level. This first transfer gate off state voltage level is denoted as level 500 of the TG signal in the timing diagram. The TG signal line is connected to the second transfer gate off state voltage level TG_OFF_LO_V when TG_CTRL is at a logic low level and TG_OFF_SEL is at a logic high level. This second transfer gate off state voltage level is denoted as level 502 of the TG signal.

Further shown in the FIG. 5 timing diagram are exemplary sampling signals SHR and SHS. These sampling signals typically operate switches outside of the pixel array 200 in order to permit the pixel signal output at common output line PIX_OUT to be sampled onto capacitors. While such sampling operations are commonly used in reading out the pixels, alternative readout arrangements may be used in other embodiments. For example, instead of sampling the signals onto capacitors, the signals could be converted to digital values and the digital values stored in memory for later use. These and other types of sampling and associated circuitry for implementing the sampling are well understood by those skilled in the art, and are therefore not described in detail herein. In the present embodiment, the sampling takes place during the times in FIG. 5 when the sampling signals SHR and SHS are at logic high levels.

The signaling illustrated in the FIG. 5 timing diagram corresponds generally to a single readout operation of the pixel 300 of FIG. 4. Just prior to time $T_1$, the RS signal goes low to connect the source follower transistor 308 to the common output line PIX_OUT via row select transistor 310. At time $T_1$, TG_OFF_SEL changes state to switch the TG signal from the first of state voltage level TG_OFF_HI_V to the second off state voltage level TG_OFF_LO_V. The effect of this switching is seen as a slight reduction in the TG signal level from level 500 to level 502. The RG signal is then briefly brought low in order to reset the floating diffusion of the pixel.

During the time that the SHR signal is high, the reset state of the floating diffusion is captured by, for example, sampling the voltage onto a capacitor or converting the signal to digital form and storing it. The TG_CTRL signal then briefly pulses high in order to switch the TG signal to the on state voltage level TG_ON_V. This turns on the transfer gate 304 of the pixel and allows the charge to flow from the photodiode 302 into the floating diffusion. After the TG signal returns to the TG_OFF_LO_V level 502, the new state of the floating diffusion is captured during the time that the SHS signal is high. Since the pixel readout operation is now substantially complete, the TG_OFF_SEL signal changes state again at time $T_2$ in order to return the TG signal to the TG_OFF_HI_V level 500. Finally, the RS signal is brought back to a high level after time $T_2$ in order to turn off the row select transistor 310 and thereby disconnect the pixel 300 from the common output line PIX_OUT.

The particular off state voltage levels utilized in a given embodiment may vary depending upon implementation-specific factors such as the types of voltage sources utilized in the image sensor. By way of example, in one possible PMOS implementation of the FIG. 4 circuitry, the transfer gate off state high voltage level 500 may be on the order of 3.3 to 3.5 volts, while the transfer gate off state low voltage level 502 may be on the order of 2.7 volts. In a corresponding NMOS implementation, the transfer gate off state high voltage level 500 may be on the order of −0.6 to −0.8 volts, while the transfer gate off state low voltage level 502 may be on the order of 0 volts.

The terms "low" and "high" in the context of transfer gate off state voltage levels thus refer to the magnitudes of the respective voltage levels. More specifically, the potential difference between gate and body portions of the transfer gate is the quantity of interest. In a PMOS implementation, the n-well may be held to 2.7 volts, for example, with the transfer gate off state high voltage of 3.3 to 3.5 volts providing a potential difference between the gate and body of 0.6 to 0.8 volts, and the transfer gate off state low voltage of 2.7 volts providing a potential difference of 0 volts. In a corresponding NMOS implementation, the p-well or p-type epitaxial layer may be held to 0 volts, with the transfer gate off state high voltage of −0.6 to −0.8 volts providing a potential difference between the gate and body of −0.6 to −0.8 volts, and the transfer gate off state low voltage of 0 volts providing a potential difference of 0 volts. The transfer gate off state high voltage thus provides a potential difference between the gate and body portions of the transfer gate that is relatively larger or has a higher magnitude, in absolute terms, than the potential difference provided by the transfer gate off state low voltage. Of course, the particular off state voltage level values mentioned above are only examples, and other values may be used in alternative embodiments.

As indicated previously, the signaling shown in FIG. 5 is for a single readout operation of the pixel 300. Other pixels of the pixel array 200 are read out in a similar manner, with the signals RG, TG and RS generally being common to a particular row of pixels of the array.

Figure 6:
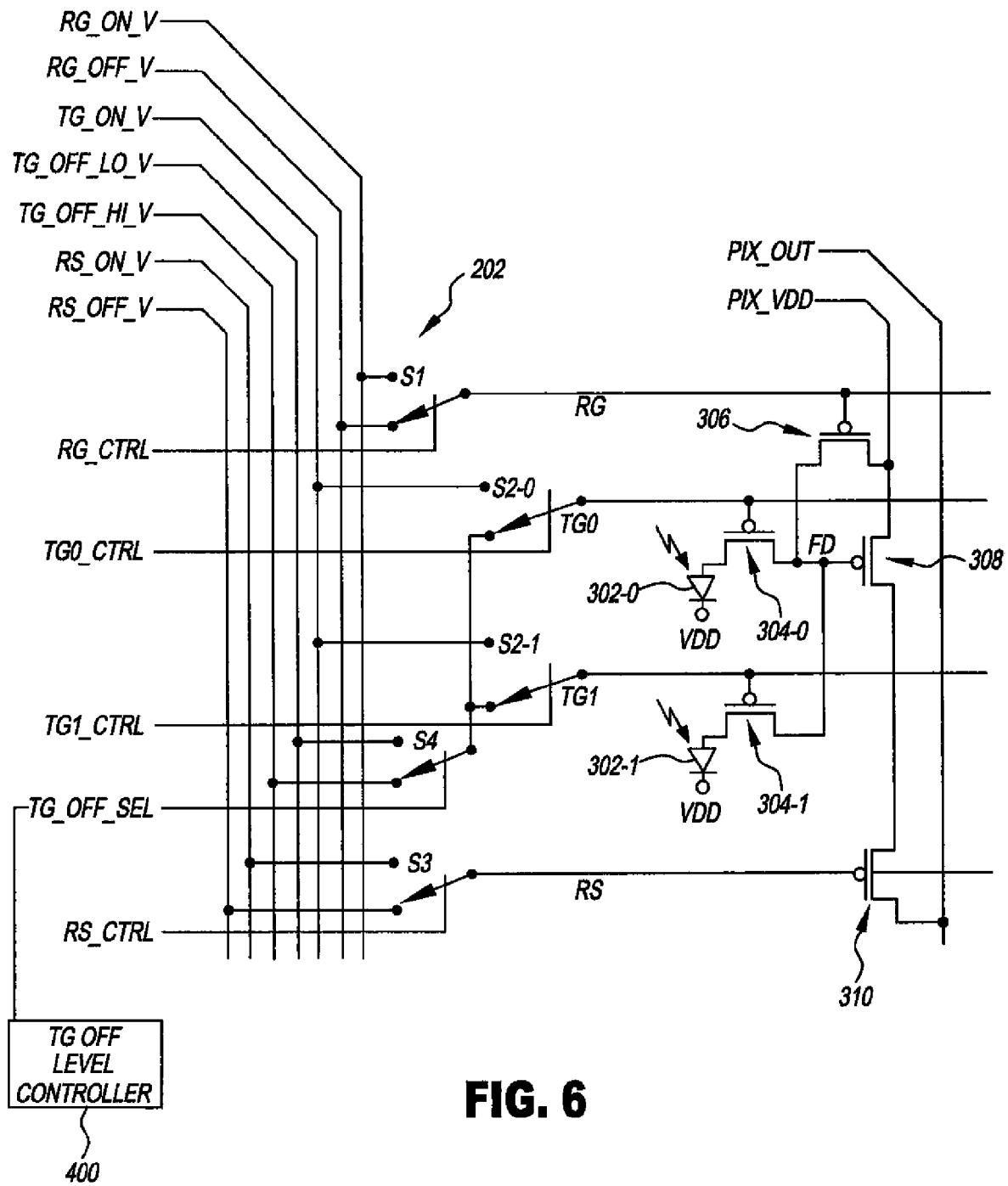
FIG. 6 shows another example of image sensor circuitry incorporating controllable transfer gate off state voltage levels in an embodiment of the invention.

FIG. 6 shows an alternative embodiment of the image sensor circuitry of FIG. 4. In this embodiment, two photodiodes 302-0 and 302-1 share the floating diffusion FD, reset gate 306, source follower 308, and row select transistor 310. The photodiodes 302-0 and 302-1 are coupled to respective transfer gates 304-0 and 304-1 as shown. The transfer gates 304-0 and 304-1 are controlled by respective transfer gate signals TG0 and TG1. The transfer gate signals are switched between their on state and off state voltage levels using respective switches S2-0 and S2-1 responsive to respective control signals TG0_CTRL and TG1_CTRL. The switch S4 in this embodiment is configured to control the switching of both of these transfer gate signals between the first off state voltage level TG_OFF_HI_V and the second off state voltage level TG_OFF_LO_V. Since both transfer gates 304-0 and 304-1 share a common floating diffusion, the off state voltage levels of both transfer gates are switched to TG_OFF_LO_V during the readout operation even if only one of the photodiodes 302-0 and 302-1 is being read. This prevents the transfer gate of the photodiode that is not being read from contributing dark current to the floating diffusion during the readout of the other photodiode. Other types of sharing arrangements may be used in other embodiments, such as arrangements in which groups of three or four photodiodes each share a common floating diffusion and other readout circuitry elements.

The embodiments of FIGS. 4 and 6 are illustrative examples of arrangements in which a transfer gate signal is controllably switchable between at least three distinct voltage levels including the on state voltage level and the first and second off state voltage levels. As noted above, it is also possible to change the transfer gate off state voltage levels by altering a well voltage of an n-well or p-well in which the transfer gates are formed, as will now be described in greater detail.

Figure 7:
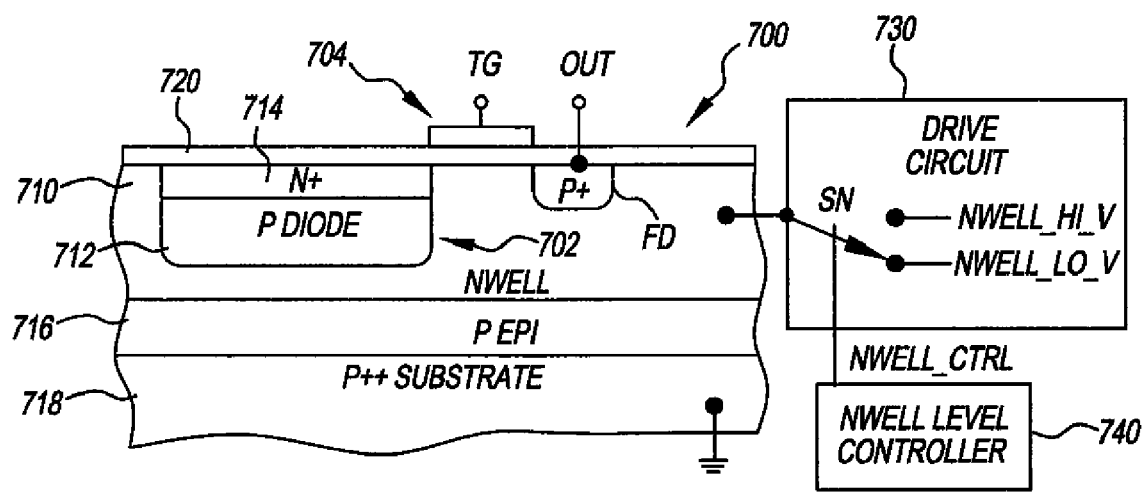
FIG. 7 shows a pixel cross-sectional view and an associated drive circuit and controller implementing controllable transfer gate off state voltage levels in another embodiment of the invention.

FIG. 7 shows a cross-sectional view of a single pixel 700 of the pixel array 200. The pixel 700 comprises a photodiode 702 and a transfer gate 704. The photodiode is a pinned photodiode formed in an n-well 710 and comprises a p-type collection region 712 and an n+ pinning layer 714. The n-well 710 is formed in a p-type epitaxial layer 716 on a p++ substrate 718. The substrate 718 is coupled to ground potential as indicated. The floating diffusion FD comprises a p+ diffusion region formed in the n-well 710. An oxide layer 720 is formed above the photodiode 702 and floating diffusion FD.

Also shown in FIG. 7 is a drive circuit 730 that supplies a controllable voltage level to the n-well 710. The controllable voltage level is selectable via a switch SN between a first n-well voltage level NWELL_LO_V and a second n-well voltage level NWELL_HI_V that is higher than the first. The state of the switch SN is controlled by a control signal NWELL_CTRL supplied to the drive circuit 730 from an n-well voltage level controller 740. The drive circuit in this embodiment is assumed to be an element of the controllable signal generator 202. Like the controller 400 of FIGS. 4 and 6, the controller 740 may be, for example, incorporated into the signal generator 202, or alternatively may be part of the processor 106.

Although not illustrated in FIG. 7, other readout circuitry such as a reset gate, source follower and row select transistor, arranged generally as shown in FIG. 3, may be associated with the pixel 700.

Figure 8:
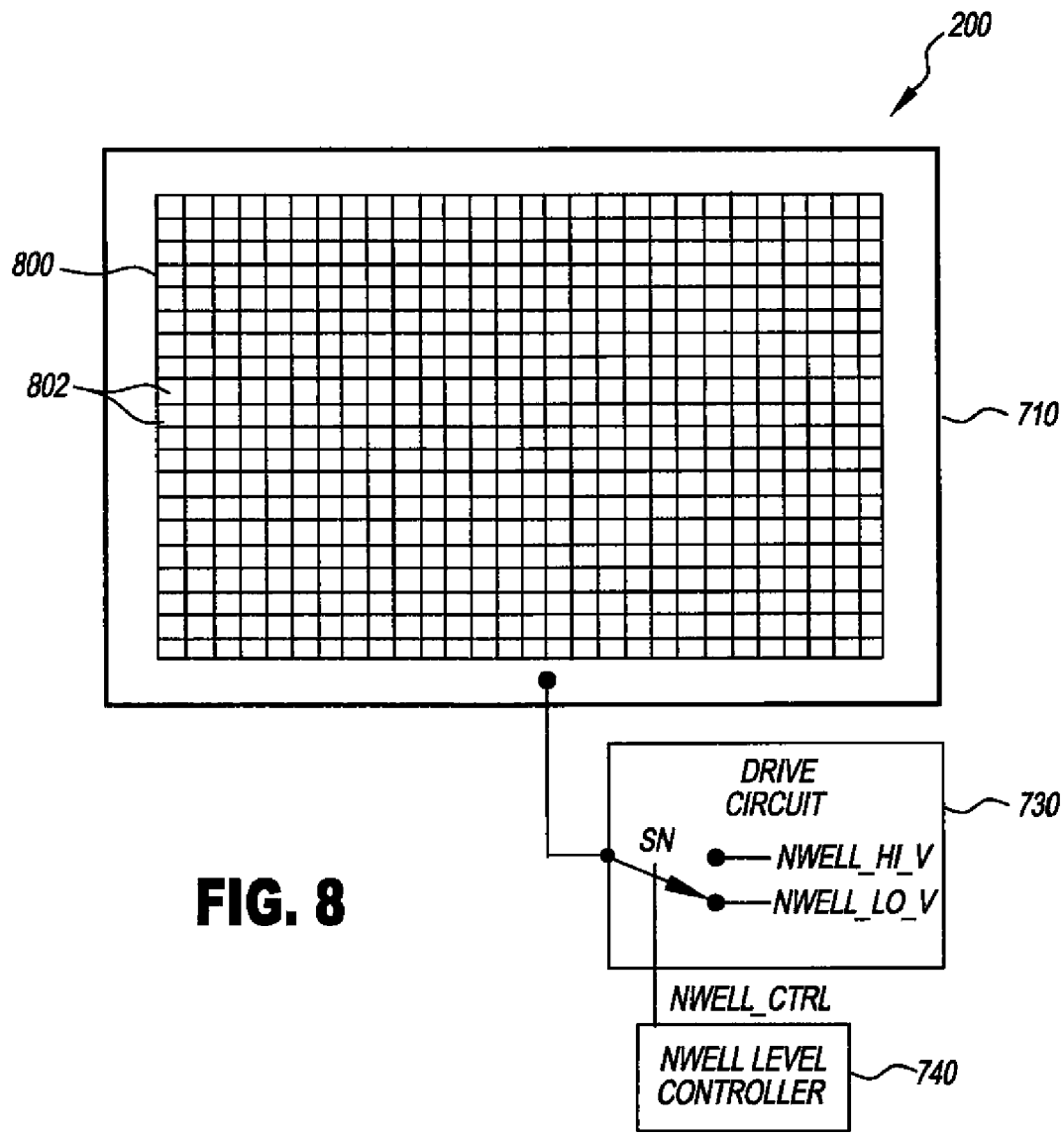
FIG. 8 shows a pixel array plan view for an image sensor including the pixel and other elements illustrated in FIG. 7.

FIG. 8 shows a plan view of the pixel array 200 comprising a set 800 of individual pixels 802 arranged in rows and columns. The pixels 802 are formed in n-well 702. A given one of the pixels 802 corresponds to pixel 700 of FIG. 7. As can be seen from FIG. 8, a single drive circuit 730 may be used to adjust the n-well voltage for the entire pixel array. Alternatively, multiple instances of such n-well drive circuits may be distributed within a given image sensor, so as to reduce the distance between a given pixel and the nearest drive circuit.

It should also be noted that all of the pixels of a given array need not be formed in a single well as is shown in FIG. 8. For example, a given pixel array may have different groups of pixels formed in different wells, with a separate drive circuit being used for each of the wells. It is also possible for an image sensor to have certain pixels that are formed in wells and others that are not formed in wells.

Figure 9:
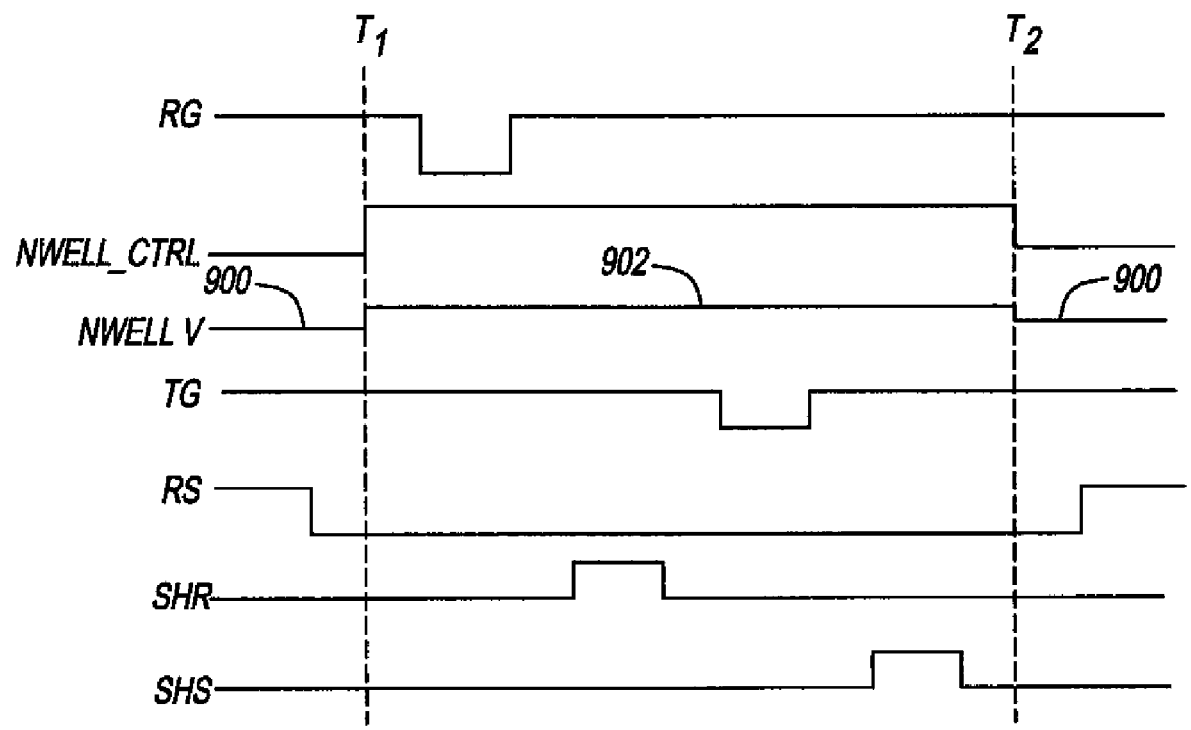
FIG. 9 is a timing diagram illustrating the operation of the image sensor circuitry of FIGS. 7 and 8.

The readout operation of the pixel 700 is generally the same as previously described in conjunction with the timing diagram of FIG. 5, except that switch S4 and its control signal TG_OFF_SEL are eliminated. The control signal NWELL_CTRL is generally operated in the same manner as the TG_OFF_SEL control signal. FIG. 9 illustrates the NWELL_CTRL timing with respect to other signals during readout, and shows the corresponding changes to the n-well voltage, labeled NWELL V in the figure. Thus, in the readout operation for pixel 700, the NWELL_CTRL signal just prior to time $T_1$ is at a logic low level, such that the n-well 710 is connected to the lower voltage level NWELL_LO_V via switch SN. At time $T_1$, the NWELL_CTRL signal transitions from a logic low level to a logic high level, causing switch SN to connect the n-well 710 to the higher voltage level NWELL_HI_V. Since the TG voltage is held constant during this time, except for when TG goes low to transfer charge from the photodiode into the floating diffusion, the raising of the n-well voltage from a first level 900 to a second level 902 in effect reduces the transfer gate off state voltage level from a higher level to a lower level during the readout operation, thereby advantageously reducing the floating diffusion dark current attributable to GIDL. At time $T_2$, the NWELL_CTRL signal transitions back from the logic high level to the logic low level, causing switch SN to reconnect the n-well 710 to the lower voltage level NWELL_LO_V.

The high and low n-well voltage levels NWELL_HI_V and NWELL_LO_V, like other voltage levels described herein, may vary in a given embodiment depending upon implementation-specific factors such as the types of voltage sources utilized in the image sensor. By way of example, in one possible PMOS implementation of the embodiment of FIGS. 7 and 8, the high voltage level NWELL_HI_V may be on the order of 3.0 to 3.3 volts, while the low voltage level NWELL_LO_V may be on the order of 2.7 volts. In a corresponding NMOS implementation, the high voltage level NWELL_HI_V may be on the order of −0.3 to −0.6 volts, while the low voltage level NWELL_LO_V may be on the order of 0 volts. Other voltage level values may be used in other embodiments.

As noted above, the potential difference between the gate and body portions of the transfer gate is the quantity of interest. In a PMOS implementation, the transfer gate may be held to an off state of 3.3 volts, for example, with an n-well low voltage of 2.7 volts providing a potential difference between the gate and body of 0.6 volts, and with an n-well high voltage of 3.3 volts providing a potential difference of 0 volts. In a corresponding NMOS implementation, the transfer gate may be held to an off state of −0.6 volts, for example, with a p-well low voltage of 0 volts providing a potential difference between the gate and body of −0.6, and with a p-well high voltage of −0.6 volts providing a potential difference of 0 volts. The n-well or p-well low voltage thus provides a potential difference between the gate and body portions of the transfer gate that is relatively larger or has a higher magnitude, in absolute terms, than the potential difference provided by the n-well or p-well high voltage.

It should be noted that the term "transfer gate signal" as used herein is intended to be broadly construed, and is not limited to the TG signal shown in certain figures. Thus, for example, the above-described potential difference between gate and body portions of a given transfer gate may be viewed as a type of transfer gate signal as that term is used herein.

The illustrative embodiments of FIGS. 3 through 9 utilize pixels comprising PMOS devices. As noted above, corresponding alternative embodiments may be formed utilizing pixels comprising NMOS devices. The operation of these NMOS embodiments is generally similar to that of the corresponding PMOS embodiments previously described except that the NMOS devices are active high rather than active low and so the signaling levels of the RG, TG and RS signals in the FIG. 5 and FIG. 9 timing diagrams would be reversed. With reference to the embodiment of FIGS. 7 and 8 in which the PMOS devices are formed in an n-well region on a p-type substrate, the NMOS devices of a corresponding NMOS embodiment would typically be formed in a p-well region on an n-type substrate.

In the embodiments described above, there are two distinct transfer gate off state voltage levels. In other embodiments, more than two off state voltage levels may be used. Also, the particular switching arrangements illustrated in the timing diagrams of FIG. 5 and FIG. 9 may be varied. For example, transitions in the TG signal from a higher off state voltage level to a lower off state voltage level could be initiated by other signals such as a falling edge of the RG signal shown in FIG. 5. Similarly, transitions in the TG signal from a lower off state voltage level to a higher off state voltage level could be initiated by other signals such as a falling edge of the SHS signal shown in FIG. 5.

The above-described illustrative embodiments advantageously provide improved control of both photodiode dark current and GIDL-based floating diffusion dark current in a CMOS image sensor, thereby overcoming a significant problem associated with conventional arrangements.

The invention has been described in detail with particular reference to certain illustrative embodiments thereof, but it will be understood that variations and modifications can be effected within the scope of the invention as set forth in the appended claims. For example, the disclosed techniques can be adapted for use with other types of image sensors and implemented using other arrangements of image sensor circuitry. Thus, the particular types of drive circuits used and their associated controllers may be varied in alternative embodiments. As a more particular example, multiple off state voltage level drive circuitry of the type illustrated in FIGS. 4 and 6 can be implemented using a wide variety of other types of circuit elements. These and other alternative embodiments will be readily apparent to those skilled in the art.

PARTS LIST 100 digital camera
102 imaging stage
104 image sensor
106 processor
108 memory
110 display
112 input/output (I/O) elements
200 pixel array
202 controllable signal generator
204 signal processing circuitry
300 PMOS pixel
302 photodiode
304 transfer gate
306 reset gate
308 source follower transistor
310 row select transistor
S1-S4 switches
400 off state voltage level controller
500 first off state voltage level
502 second off state voltage level
700 PMOS pixel
702 photodiode
704 transfer gate
710 n-well
712 collection region
714 pinning layer
716 p-type epitaxial layer
718 p-type substrate
720 oxide layer
730 n-well drive circuit
740 n-well voltage level controller
SN n-well drive circuit switch
800 set of pixels
802 individual pixel
900 first n-well voltage level
902 second n-well voltage level

The invention claimed is:

1. An image sensor comprising:
a pixel array comprising a plurality of pixels each having a photosensitive element coupled to a transfer gate; and
a signal generator coupled to the pixel array;
wherein the signal generator is configured to generate a transfer gate signal for application to at least one of the transfer gates; and
wherein the transfer gate signal has at least an on state voltage level and first and second off state voltage levels, wherein the first off state voltage level has a higher magnitude than that of the second off state voltage level, and wherein the transfer gate signal has the second off state voltage level during readout of one or more of the pixels.

2. The image sensor of claim 1 wherein during said readout of one or more of the pixels the transfer gate signal transitions from the first off state voltage level to the second off state voltage level and then from the second off state voltage level to the on state voltage level.

3. The image sensor of claim 2 wherein after transitioning to the on state voltage level during said readout of one or more of the pixels the transfer gate signal transitions from the on state voltage level back to the second off state voltage level and then from the second off state voltage level back to the first off state voltage level.

4. The image sensor of claim 1 wherein during readout of a given row of pixels of the pixel array the transfer gate signal is applied to each of the transfer gates of the pixels in the given row.

5. The image sensor of claim 4 wherein during readout of the given row of pixels of the pixel array the transfer gate signal is also applied to each of the transfer gates of the pixels in at least one additional row of pixels of the pixel array.

6. The image sensor of claim 1 wherein the transfer gate signal has the second off state voltage level during at least a portion of said readout in which a reset signal is applied to a floating diffusion of said one or more pixels.

7. The image sensor of claim 1 wherein the transfer gate signal has the second off state voltage level during at least a portion of said readout in which a signal on a floating diffusion of said one or more pixels is sampled in response to a sampling signal.

8. The image sensor of claim 1 wherein the signal generator comprises drive circuitry configured to generate the first and second off state voltage levels of the transfer gate signal responsive to an off state voltage level control signal.

9. The image sensor of claim 8 wherein the drive circuitry comprises a switch operative to switch a transfer gate signal line between the first and second off state voltage levels responsive to the off state voltage level control signal.

10. The image sensor of claim 8 wherein said drive circuitry generates first and second off state voltage levels for multiple transfer gate signals of the pixel array.

11. The image sensor of claim 1 wherein the pixels of the pixel array are formed in a well of a first conductivity type on a substrate of a second conductivity type.

12. The image sensor of claim 11 wherein the transfer gate signal is controllably switched between the first and second off state voltage levels by altering a voltage level applied to the well.

13. The image sensor of claim 12 wherein the signal generator comprises drive circuitry configured to control the first and second off state voltage levels of the transfer gate signal by applying respective voltage levels to the well responsive to a well voltage level control signal.

14. A method for use in an image sensor comprising a pixel array having a plurality of pixels each with a photosensitive element coupled to a transfer gate, the method comprising the step of:
generating a transfer gate signal for application to at least one of the transfer gates;
wherein the transfer gate signal has at least an on state voltage level and first and second off state voltage levels, the first off state voltage level having a higher magnitude than that of the second off state voltage level, and
reading out one or more of the pixels while the transfer gate signal has the second off state voltage level.

15. The method of claim 14 wherein the generating step further comprises switching a transfer gate signal line between the first and second off state voltage levels responsive to an off state voltage level control signal.

16. The method of claim 14 wherein the generating step further comprises controllably switching between the first and second off state voltage levels by altering a voltage level applied to a well in which the pixels are formed.

17. A digital imaging device comprising:
an image sensor; and
one or more processing elements configured to process outputs of the image sensor to generate a digital image;
wherein said image sensor comprises:
a pixel array comprising a plurality of pixels each having a photosensitive element coupled to a transfer gate; and
a signal generator coupled to the pixel array;
wherein the signal generator is configured to generate a transfer gate signal for application to at least one of the transfer gates; and
wherein the transfer gate signal has at least an on state voltage level and first and second off state voltage levels, wherein the first off state voltage level has a higher magnitude than that of the second off state voltage level, and wherein the transfer gate signal has the second off state voltage level during readout of one or more of the pixels.

18. The digital imaging device of claim 17 wherein said imaging device comprises a digital camera.

19. The digital imaging device of claim 17, wherein the image sensor is a CMOS image sensor.

* * * * *